(12) United States Patent
Kobayashi

(10) Patent No.: US 11,047,732 B2
(45) Date of Patent: Jun. 29, 2021

(54) ELECTROMAGNETIC WAVE DETECTION DEVICE

(71) Applicant: PIONEER CORPORATION, Tokyo (JP)

(72) Inventor: Hideki Kobayashi, Kawagoe (JP)

(73) Assignee: PIONEER CORPORATION, Tokyo (JP)

( * ) Notice: Subject to any disclaimer, the term of this patent is extended or adjusted under 35 U.S.C. 154(b) by 4 days.

(21) Appl. No.: 16/634,537

(22) PCT Filed: Jul. 17, 2018

(86) PCT No.: PCT/JP2018/026637
§ 371 (c)(1),
(2) Date: Jan. 27, 2020

(87) PCT Pub. No.: WO2019/021874
PCT Pub. Date: Jan. 31, 2019

(65) Prior Publication Data
US 2020/0225083 A1    Jul. 16, 2020

(30) Foreign Application Priority Data
Jul. 28, 2017    (JP) .............................. JP2017-146361

(51) Int. Cl.
*G01J 1/04*    (2006.01)
(52) U.S. Cl.
CPC .................... *G01J 1/0407* (2013.01)
(58) Field of Classification Search
CPC ........ G01J 1/0407; G01J 1/0214; H04N 5/33; H04N 5/335; H01L 31/0232
See application file for complete search history.

(56) References Cited

U.S. PATENT DOCUMENTS

| 5,497,003 A | * | 3/1996 | Baliga ....................... G01J 3/36 250/338.3 |
| 2012/0012741 A1 | | 1/2012 | Vasylyev |
| 2012/0327970 A1 | * | 12/2012 | Haw ........................ G01J 5/06 374/121 |
| 2013/0313674 A1 | | 11/2013 | Noda |

(Continued)

FOREIGN PATENT DOCUMENTS

| JP | S59-50449 A | 4/1984 |
| JP | 7-146174 A | 6/1995 |

(Continued)

OTHER PUBLICATIONS

European Search Report corresponding to European Application No. EP18837255.1, dated Feb. 8, 2021 (7 pages).

(Continued)

*Primary Examiner* — Marcus H Taningco
(74) *Attorney, Agent, or Firm* — Procopio, Cory, Hargreaves & Savitch LLP

(57) ABSTRACT

An electromagnetic wave detection device comprising a support body having one surface to be irradiated with an electromagnetic wave, at least one electromagnetic wave detection element provided on the support body, and at least one waveguide structure each of which is supported on the support body, has a first aperture opened to a side of the one surface of the support body, and forms a waveguide that narrows in a direction away from the one surface.

9 Claims, 5 Drawing Sheets

(56) References Cited

U.S. PATENT DOCUMENTS

2015/0003777 A1\* 1/2015 Tseng ............... H01L 27/14627
                                                       385/14
2015/0108336 A1   4/2015 Dong et al.

FOREIGN PATENT DOCUMENTS

| JP | 2012-215436 A | 11/2012 |
| JP | 2013-246021 A | 12/2013 |
| JP | 2014-099468 A |  5/2014 |
| JP | 2016-213732 A | 12/2016 |

OTHER PUBLICATIONS

International Search Report for related International Application No. PCT/JP2018/026637, dated Oct. 16, 2018; English translation provided (5 pages).

\* cited by examiner

ELECTROMAGNETIC WAVE DETECTION DEVICE

CROSS-REFERENCE TO RELATED APPLICATIONS

This application is a U.S. National Stage entry of PCT Application No: PCT/JP2018/026637 filed Jul. 17, 2018, which claims priority to Japanese Patent Application No. 2017-146361, filed Jul. 28, 2017, the contents of which are incorporated herein by reference.

TECHNICAL FIELD

The present invention relates to an electromagnetic wave detection device.

BACKGROUND OF THE INVENTION

An electromagnetic wave detection device is, for example, a device which detects an electromagnetic wave having a predetermined characteristic (such as a wavelength or intensity), and generates an electric signal corresponding to the presence or absence of the electromagnetic wave to be detected and its characteristics. For example, Patent Literature 1 discloses a terahertz element module including a terahertz element for emitting or detecting a terahertz wave.

CITATION LIST

Patent Literature

Patent Literature 1: Japanese Patent Kokai No. 2016-213732.

SUMMARY OF INVENTION

Technical Problem

It is preferable that an electromagnetic wave detection element can accurately detect only an electromagnetic wave to be detected. Specifically, for example, a primary electromagnetic wave which is directly incident on the detection element through a path (ideal path) in the design of the device and captured by a receiving portion (light receiving portion) of the device may be a preferred electromagnetic wave as a wave to be detected.

On the other hand, there is an indirect wave which is indirectly incident on the detection element, such as an electromagnetic wave that is incident on the detection element after being reflected in the housing containing the detection element. It is possible that the indirect electromagnetic wave has characteristics changed from those of the primary electromagnetic wave. The secondary electromagnetic wave incident on the detection element through a path different from the designed path or the path in the design of the device may be an undesirable electromagnetic wave as the wave to be detected.

The electromagnetic wave detection device such as a line sensor or a matrix sensor, which performs the electromagnetic wave detection operation one-dimensionally or two-dimensionally, comprise a plurality of detection elements arranged in a line or array. In this case, the electromagnetic wave to be detected and the path in the design of the device are different for each of the plurality of detection elements.

Therefore, given accurately detecting the presence of an electromagnetic wave and its characteristics, it is preferable that the electromagnetic wave detection device is configured so that only an electromagnetic wave to be detected is incident on a detection element. In other words, it is preferable that electromagnetic waves that are not subject to detection, that is, electromagnetic waves that pass through paths other than the path in the design of the device, are prevented from entering the detection element.

The present invention has been made in view of the foregoing circumstances. An object of the present invention is to provide an electromagnetic wave detection device capable of performing an accurate detection operation by suppressing electromagnetic waves which should not be detected, from being incident on a detection element.

Solution to Problem

The invention recited in claim 1 is an electromagnetic wave detecting device comprising a support body having one surface to be irradiated with an electromagnetic wave, at least one electromagnetic wave detection element provided on the support body, and at least one waveguide structure each of which is supported on the support body, has a first aperture opened to a side of the one surface of the support body, and forms a waveguide that narrows in a direction away from the one surface.

DESCRIPTION OF EMBODIMENTS

Embodiments of the present invention will be described in detail below.

First Embodiment

Figure 1:
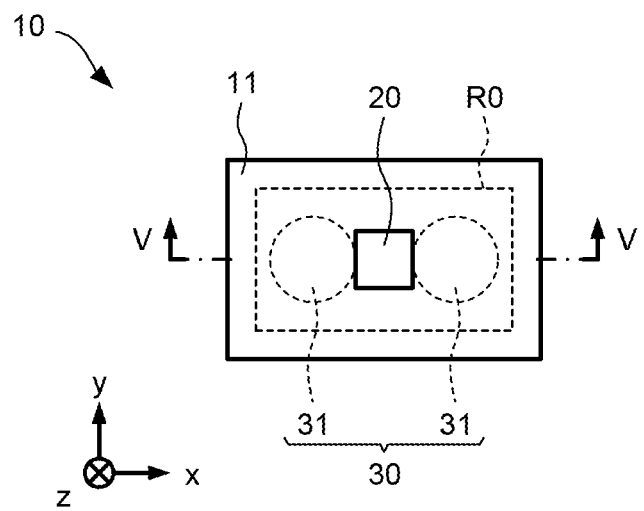
FIG. 1 is a top view of an electromagnetic wave detection device according to a first embodiment.
Figure 2:
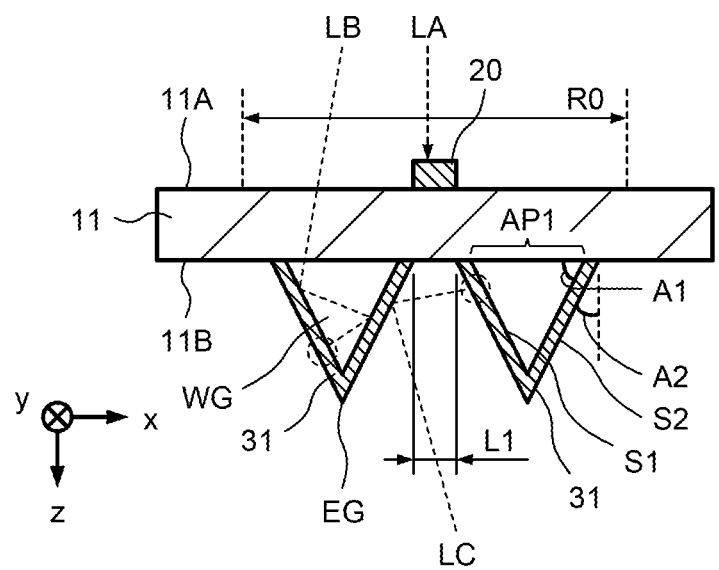
FIG. 2 is a cross-sectional view of an electromagnetic wave detection device according to the first embodiment.

FIG. 1 is a schematic top view of an electromagnetic wave detection device (hereinafter simply referred to as a detection device) 10 according to the first embodiment. FIG. 2 is a cross-sectional view of the detection device 10. FIG. 2 is a sectional view made along a line V-V shown in FIG. 1. The detection device 10 will be described with reference to FIGS. 1 and 2.

The detection device 10 includes a support body 11 and a detection part 20 supported on the support body 11. The detection part 20 includes at least one electromagnetic wave detection element (hereinafter, simply referred to as a detection element). This embodiment will be described regarding the detection device 10 in which the detection part 20 is composed of one detection element. In other words, in this embodiment, the detection device 10 includes the detection element 20 as a detection part.

In this embodiment, the detection element 20 detects an electromagnetic wave in the frequency band of 0.1-10 THz (terahertz wave), which is the frequency band between a radio wave and an infrared light, and detects the presence or absence of an electromagnetic wave to be detected and its intensity. Moreover, in this embodiment, as shown in FIG. 1, the detection element 20 has a rectangular planar shape.

For example, the detection element 20 includes a semiconductor element such as a schottky barrier diode, a resonant tunnel diode and so on. For example, the detection element 20 includes a photoelectric conversion part (not shown) that generates an electric signal corresponding to an electromagnetic wave to be detected among electromagnetic waves incident on the part.

In this embodiment, the support body 11 is a substrate having a flat plate shape and having principal surfaces parallel to each other. One of the principal surfaces is a top surface 11A (one surface) of the substrate and the other of the principal surfaces is a bottom surface 11B (another surface). Moreover, the detection device 10 is arranged so that the electromagnetic wave to be detected is irradiated onto the top surface 11A of the support body 11. Therefore, in this embodiment, the top surface 11A of the support body 11 functions as an irradiated surface onto which an electromagnetic wave is irradiated.

In other words, the detection device 10 includes the support body 11 having the top surface (one surface) 11A, onto which an electromagnetic wave is irradiated, and the detection element 20 provided on the support body 11. The support body 11 has a wiring (for example, a wiring for driving and signal processing) electrically connected to the detection element 20.

The support body 11 is made of a material having transparency to an electromagnetic wave (terahertz wave in this embodiment) to be detected. For example, the support body 11 is made of a resin material, and is made of, for example, ebonite. Ebonite has a refractive index relatively close to air with respect to the terahertz wave. Therefore, when ebonite is used for the support body 11, most of the terahertz wave irradiated onto the top surface 11A of the support body 11 is incident on and transmitted through the support body 11.

In this embodiment, an electromagnetic wave is irradiated to a central portion of the top surface 11A of the support body 11. Accordingly, as shown in FIGS. 1 and 2, the center portion of the top surface 11A of the support body 11 functions as an irradiation region R0 of the electromagnetic wave.

The irradiation region R0 is a region in which the electromagnetic wave to be detected is directly incident on and transmitted through the support body 11 after that the electromagnetic wave to be detected has entered through an incident portion (not shown) of the electromagnetic wave in the design of the detection device 10.

For example, in the case where the incident portion (light receiving portion) of the electromagnetic wave in the detection device 10 has a rectangular shape, as shown in FIG. 1, the irradiation region R0 is a substantially rectangular region surrounding the detection element 20 when viewed from a direction perpendicular to the top surface 11A (surface of the surface 11) of the support body 1.

The detection device 10 has an electromagnetic wave guide portion 30 which is supported on a support body 11 and forms waveguides of electromagnetic waves. In this embodiment, as shown in FIG. 1, the electromagnetic wave guide portion 30 has two (one pairs) waveguide structures 31 arranged to sandwich the detection element 20 when viewed from the direction perpendicular to the top surface 11A of the support body 11.

In addition, as shown in FIG. 2, in the present embodiment, each of the waveguide structures 31 is fixed on a bottom surface 11B of the support body 11. Further, each of the waveguide structures 31 includes an aperture (first aperture) AP1 opened to the top surface 11A side of the support body 11 (that is, opened on the incident portion side of the electromagnetic wave in the detection device 10), and forms a waveguide WG that narrows in a direction away from the top surface 11A.

In this embodiment, each of the waveguide structures 31 has a circular aperture AP1 as shown in FIG. 1, and has an inner wall surface S1 having a tapered shape in which the aperture width becomes smaller as it moves away from the aperture AP1. In this embodiment, each of the waveguide structures 31 forms a hollow waveguide by means of the aperture AP1 and the inner wall surface S1. In FIG. 1, the apertures AP1 of the waveguide structures 31 are indicated by broken lines.

In this embodiment, each of the waveguide structures 31 forms a waveguide in its entirety. For example, each of the waveguide structures 31 is a cylindrical member made of a cylindrical material having a cylindrical metal tube, a cylindrical material having a metal film on its surface, or a cylindrical material plated on its surface. Each of the waveguide structures 31 is a tapered waveguide in which the inner wall surface S1 and the outer wall surface S2 are tapered while maintaining a thickness (a distance between both wall surfaces).

In this embodiment, each of the waveguide structures 31 has a closed end portion EG formed on an end portion opposite to the aperture AP1. In other words, in this embodiment, each of the waveguide structures 31 forms a waveguide WG in which one end is opened by the aperture AP1 and the other end is closed by the closed end portion EG. In this embodiment, the closed end portion EG is the apex of the waveguide structure 31 in which the inner wall surface S1 and the outer wall surface S2 of the waveguide structure 31 converge to one point. Thus, in this embodiment, each of the waveguide structures 31 forms a conical waveguide WG.

The electromagnetic wave to be detected is irradiated onto the top surface 11A of the support body 11. Therefore, the electromagnetic wave to be detected is irradiated to the support body 11 so as to have a component in a z direction which is a direction perpendicular to the top surface 11A (and the bottom surface 11B).

In this specification, the direction parallel to the top surface 11A and the bottom surface 11B of the support body 11 (the direction perpendicular to the z direction) and the arrangement direction of the two waveguide structures 31 (the direction opposite to each other) are referred to as an x direction. In addition, the direction perpendicular to both the z direction and the x direction is referred to as a y direction. The z direction corresponds to the thickness direction of the substrate serving as the support body 11.

As shown in FIG. 2, the inner wall surface S1 of each of the waveguide structures 31 is inclined by an angle (first angle) A1 from a bottom surface 31B of the support body 11 in a cross section obtained by cutting the waveguide structure 31 in the xz plane passing through the closed end portion EG. In addition, the outer wall surface S2 of each of the waveguide structure 31 is inclined by an angle (a second angle) A2 from a direction perpendicular to the bottom surface 11B (and the top surface 11A) of the support body 11 in the cross section.

As shown in FIG. 2, the two waveguide structures 31 are disposed such that the apertures AP1 are spaced apart from each other by a distance L1 on the bottom surface 11B of the support body 11. Specifically, the end portion on the side of the aperture AP1 of each of the waveguide structures 31 is bonded to the bottom surface 11B of the support body 11. In addition, the outer wall surfaces S2 of the two waveguide structures 31 are separated from each other by the distance L1 on the bottom surface 11B of the support body 11.

Here, the path of electromagnetic waves in the detection device 10 will be described with reference to FIG. 2. In FIG. 2, three types of electromagnetic waves LA-LC are indicated by broken lines. First, the electromagnetic wave irradiated to the irradiation region R0 on the top surface 11A of the support body 11 can be distinguished between the electromagnetic wave LA directly incident on the detection element 20 and the electromagnetic wave LB incident on the peripheral region of the detection element 20 on the top surface 11A of the support body 11.

The electromagnetic wave LA is received (light-received) by the detection element 20. Accordingly, the electromagnetic wave LA is detected by the detection element 20 (photoelectric conversion is performed).

On the other hand, the electromagnetic wave LB does not directly enter the detection element 20, but enters into the support body 11. The electromagnetic wave LB travels toward the aperture AP1 of the waveguide structure 31. Then, the electromagnetic wave LB enters into the waveguide WG of the waveguide structure 31 from the aperture AP1. Further, the electromagnetic wave LB that has entered the waveguide WG is confined in the waveguide WG, and reflection is repeated, so that the electromagnetic wave LB is attenuated or extinguished.

A primary electromagnetic wave such as the electromagnetic wave LA, is highly likely to be an electromagnetic wave to be detected, which maintains its characteristics as an electromagnetic wave to be detected. Therefore, it is preferable that the electromagnetic wave LA is reliably detected by the detection element 20.

On the other hand, an electromagnetic wave such as the electromagnetic wave LB is highly likely to be a secondary electromagnetic wave which is incident on the detection element 20 without passing through an ideal path unlike the electromagnetic wave LA. That is, the electromagnetic wave such as the electromagnetic wave LB is highly likely to be an electromagnetic wave (for example, an electromagnetic wave with noise superimposed thereon) which has characteristics different from those of the primary electromagnetic wave, namely, which is not preferable as an electromagnetic wave to be detected.

In this embodiment, the electromagnetic wave such as the electromagnetic wave LB is separated from the electromagnetic wave LA by the waveguide structure 31 (the electromagnetic wave guide portion 30). Therefore, the electromagnetic wave LB can be prevented from moving toward the detection element 20. Moreover, the electromagnetic wave that has entered into the waveguide WG is attenuated by repeating reflection. Therefore, the secondary electromagnetic wave is prevented from entering the detection element 20. Therefore, it is suppressed that an electromagnetic wave which should not be detected is incident onto the detection element 20, so that it is possible to perform an accurate detection operation.

In this embodiment, it is preferable that the inner wall surface S1 forming the waveguide WG of each of the waveguide structures 31 is inclined at an angle A1 (taper angle) larger than 45 degrees. If the inclination angle of the inner wall surface S1 is 45 degrees or less, the electromagnetic wave LB may return to the incident side via the aperture AP1 after the reflection is repeated by the inner wall surface S1.

When the electromagnetic wave LB returns to the incident side (for example, the electromagnetic wave LA side), the electromagnetic wave LB (an undesired electromagnetic wave) may be superimposed on the electromagnetic wave LA (a preferred electromagnetic wave) to be incident on the detection element 20. On the other hand, by setting the inclination angle A1 of the inner wall surface S1 to be larger than 45 degrees, the electromagnetic wave such as the electromagnetic wave LB can be surely retained within the waveguide structure 31 and attenuated.

Further, an electromagnetic wave included in the electromagnetic wave LB which is not incident on both of the detection element 20 and the waveguide structure 31 passes through the support body 11 and is emitted from the bottom surface 11B. The electromagnetic wave transmitted through the support body 11 may be repeatedly reflected within a housing (not shown) that houses, protects and fixes the detection device 10 (the support body 11 and the detection element 20), and may become stray light.

Some of the stray light may become the electromagnetic wave LC that travels from the region on the bottom surface 11B side of the support body 11 toward the detection element 20. Moreover, the electromagnetic wave LC may have characteristics that are significantly different from those of the electromagnetic wave LA. Therefore, an electromagnetic wave such as the electromagnetic wave LC is often an electromagnetic wave which is not preferable for an electromagnetic wave to be detected, as in the case of the electromagnetic wave LB.

Then, the electromagnetic wave LC may enter the detection element 20 through the bottom surface 11B from the region between the two waveguide structures 31 provided on the bottom surface 11B of the support body 11, that is, from the region directly below the detection element 20 on the bottom surface 11B of the support body 11. However, it is not preferable that the electromagnetic wave LC is incident on the detection element 20 from a region on the back side of the detection element 20 in the support body 11.

In view of the above, it is preferable that the distance L1 between the two waveguide structures 31 (the distance between the outer wall surfaces S2 on the bottom surface 11B) L1 satisfies a relationship of $L1 < (\lambda/2)$ when the wavelength of the electromagnetic wave LA to be detected is $\lambda$. For example, in order to support the waveguide structures 31, if another member (having a refractive index n) is provided in the region between the waveguide structures 31 on the bottom surface 11B of the support body 11, it is preferable that the distance L1 satisfies a relationship of $L1 < (\lambda/(2n))$.

By arranging the two waveguide structures 31 at intervals satisfying the above relationship, the electromagnetic wave LC can be optically blocked in the region between the two waveguide structures. That is, by arranging the two waveguide structures 31 at intervals satisfying the above relationship, the electromagnetic wave LC is not wave-guided to the region between the two waveguide structures 31. Therefore, an electromagnetic wave such as the electromagnetic wave LC is prevented from entering the detection element 20 from the bottom surface 11B of the support body 11. Therefore, both electromagnetic waves LB and LC, which are electromagnetic waves which should not be detected, are prevented from being incident on the detection element 20.

In this embodiment, the support body 11 which is a flat substrate having the top surface 11A serving as a surface to be irradiated and the bottom surface 11B opposed to the top surface 11A (parallel to the top surface 11A) has been described. In addition, in this embodiment, the support body 11 having the irradiation region R0 to be irradiated with electromagnetic waves on the top surface 11A has been described. However, the structure and arrangement of the support body 11 are not limited thereto. The support body 11 may have a top surface 11A to which electromagnetic waves are irradiated, and for example, the entire top surface 11A of the support body 11 may be the irradiation region R0.

In addition, in this embodiment, a case has been described in which the detection element (the detection part) 20 is formed on the top surface 11A of the support body 11, and the electromagnetic wave guide portion 30 is formed on the bottom surface 11B of the support body 11. However, the structure of the support body 11, the detection element 20, and the electromagnetic wave guide portion 30 is not limited thereto. For example, the detection element 20 and the electromagnetic wave guide portion 30 may be formed on the bottom surface 11B of the support body 11, or may be embedded in the support body 11.

In this embodiment, the electromagnetic wave guide portion 30 has two waveguide structures 31, but the number and arrangement of the waveguide structures 31 are not limited thereto. For example, the electromagnetic wave guide portion 30 may be composed of one waveguide structure 31.

In addition, the position and the size of the aperture AP of the waveguide structure 31 may be configured so that the aperture AP1 of the waveguide WG is opened to the top surface 11A side of the support body 11, that is, the incident portion side of an electromagnetic wave within the detection device 10. As a result, an electromagnetic wave which can become an electromagnetic wave which should not be detected, such as the electromagnetic wave LB, necessarily enters into the waveguide structure 31, and it is possible not to enter the detection element 20.

As described above, in this embodiment, the detection device 10 includes at least one waveguide structure 31 which is supported by the support body 11 and which have an aperture (a first aperture) AP1 opened to a surface (a top surface 11A) to be irradiated with an electromagnetic wave of the support body 11, and which forms a waveguide WG that narrows in a direction away from the irradiated surface (the top surface 11A). Therefore, it is possible to provide the electromagnetic wave detection device 10 which prevents an electromagnetic wave, which should not be detected, from being incident on the detection element 20, so that an accurate detection operation can be performed.

Figure 3:
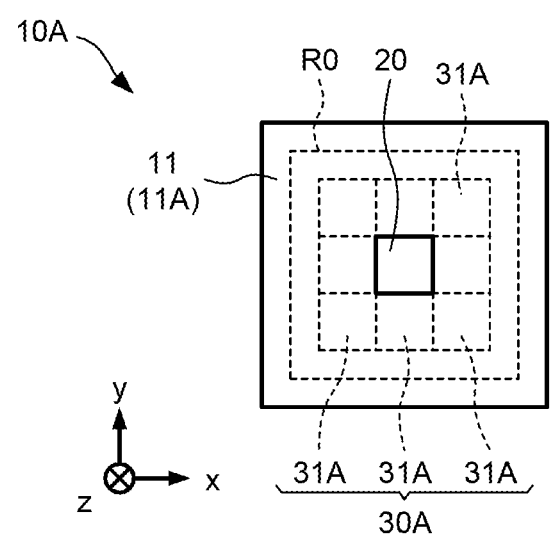
FIG. 3 is a top view of an electromagnetic wave detection device according to a first modification of the first embodiment.

FIG. 3 is a top view of a detection device 10A according to a first modification of the first embodiment. The detection device 10A has the same structure as that of the detection device 10 other than the structure of an electromagnetic wave guide portion 30A. FIG. 3 schematically shows a top surface 11A (an irradiated surface of an electromagnetic wave) of the support body 11 in the detection device 10A. In this modification, the electromagnetic wave guide 30A has waveguide structures 31A each having a rectangular aperture AP1.

In this modification, eight waveguide structures 31A are arranged so as to surround the detection element 20 when viewed from a direction perpendicular to the top surface 11A of the support body 11. The electromagnetic wave guide 30A can also be said to have four pairs of waveguide structures 31A sandwiching the detection element 20.

In this modification, most of the electromagnetic wave (that is, the electromagnetic wave LB in FIG. 2) irradiated to the area around the detection element 20 on the top surface 11A of the support body 11 enters the waveguide structures 31A. By arranging the waveguide structures 31A in this manner, the electromagnetic wave such as the electromagnetic wave LB is greatly suppressed from entering the detection element 20.

Figure 4:
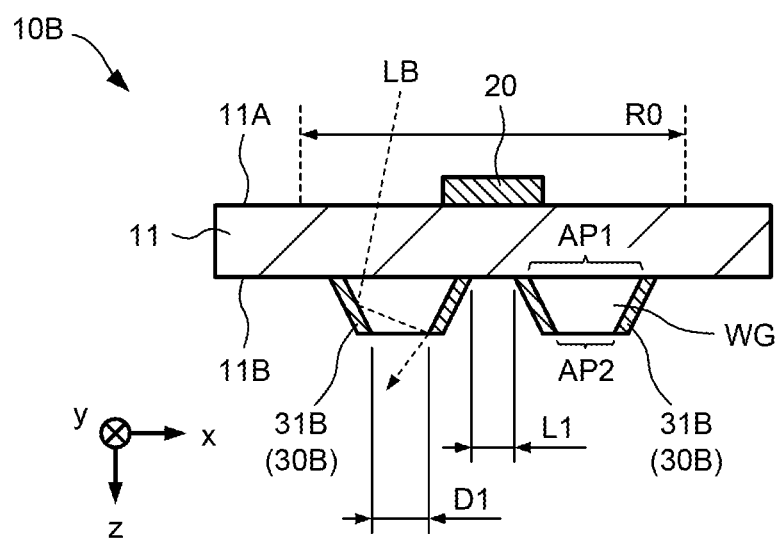
FIG. 4 is a cross-sectional view of an electromagnetic wave detection device according to a second modification of the first embodiment.

FIG. 4 is a cross-sectional view of a detection device 10B according to a second modification of the first embodiment. The detection device 10B has the same structure as that of the detection device 10 other than the structure of an electromagnetic wave guide portion 30B. FIG. 4 is a sectional view similar to that of FIG. 2 in the detection device 10B. Similarly to the electromagnetic wave guide portion 30, the electromagnetic wave guide portion 30B includes two waveguide structures 31B disposed so as to sandwich the detection element 20.

Each of the waveguide structures 31B has a waveguide WG that is opened at both ends. Specifically, each of the waveguide structures 31B has an aperture AP1 (a first aperture) similar to the waveguide structure 31 on the bottom surface 11B of the support body 11, and forms a waveguide WG that narrows in a direction away from the top surface 11A. On the other hand, each of the waveguide structures 31B has an aperture AP2 (second aperture) of the waveguide WG at an end portion opposite to the aperture AP1.

The aperture AP2 has a circular shape, for example. The aperture AP2 has an aperture width (maximum width, diameter in this modification) D1 which is smaller than the aperture AP1. That is, in this modification, each of the waveguide structures 31B has a truncated cone shaped waveguide WG.

In this modification, the aperture width (maximum width, diameter in this modification) D1 of the aperture AP2 satisfies a relationship D1≥(λ/(2n)), where λ is the wavelength of the electromagnetic wave LB (and the electromagnetic wave LA), and n is the refractive index in the waveguide WG. Since the aperture AP2 which has the aperture width D1 satisfying this condition is provided, as shown in FIG. 4, the electromagnetic wave such as the electromagnetic wave LB is guided through the waveguide WG and then is emitted from the waveguide structure 31B through the aperture AP2.

When the waveguide structure 31B is formed as in this modification, an electromagnetic wave such as the electromagnetic wave LB can be guided in a direction away from the detection element 20. Therefore, the electromagnetic wave such as the electromagnetic wave LB is prevented from entering the detection element 20.

Further, when the aperture width D1 of the aperture AP2 satisfies the above-described condition, the electromagnetic wave such as the electromagnetic wave LB is prevented from returning toward the aperture AP1. Accordingly, the electromagnetic wave LB is superimposed on the electromagnetic wave LA and the superimposed electromagnetic wave is incident on the detection element 20, whereby noise is suppressed from being superimposed.

Furthermore, also in this modification, it is preferable that the distance L1 between the apertures AP1 of the two waveguide structure 31B satisfies a relationship of $L1<(\lambda/2)$ when the wavelength of the electromagnetic wave LA is $\lambda$, and satisfies a relationship of $L1<(\lambda/(2n))$ when there is a medium having the refractive index n. Thus, an electromagnetic wave such as the electromagnetic wave LC is prevented from entering the detection element 20 from the bottom surface 11B side. Therefore, it is possible to prevent an electromagnetic wave, which should not be detected, from entering the detection element 20 and to perform an accurate electromagnetic wave detection operation.

In this modification, the interval L1 between the two waveguide structures 31B is smaller than the length of the detection element 20 in the arrangement direction (x direction) of the waveguide structures 31B. Accordingly, depending on the size of the detection element 20, the apertures AP1 of the waveguide structures 31B are arranged so as to partially overlap with the detection element 20 when viewed from the direction perpendicular to the top surface 11A of the support body 11.

For example, in the case where the detection element 20 is provided on the top surface 11A of the support body 11 and the waveguide structures 31B are provided on the bottom surface 11B, when the wavelength of the electromagnetic wave LA, that is, the wavelength of the electromagnetic wave to be detected is relatively small, a part of the aperture AP1 may overlap with the detection element 20 when viewed from above, as in the case of the waveguide structure 31B.

Figure 5:
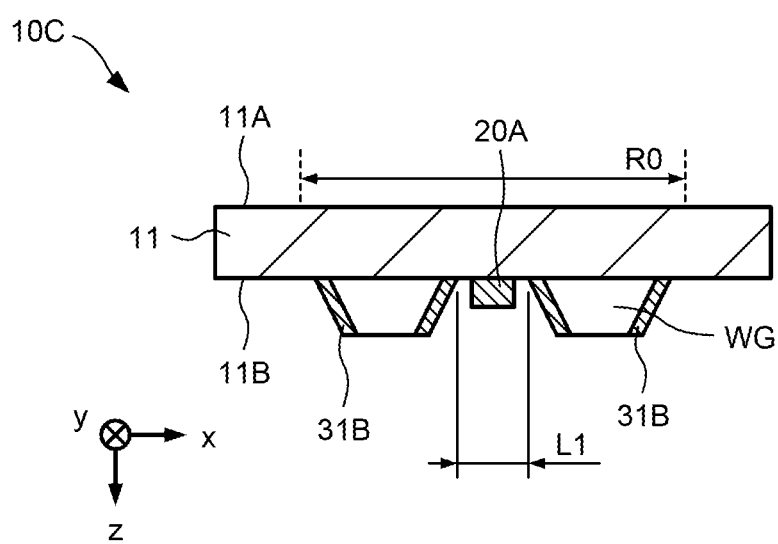
FIG. 5 is a cross-sectional view of an electromagnetic wave detection device according to a third modification of the first embodiment

FIG. 5 is a cross-sectional view of a detection device 10C according to the third modification of the first embodiment. The detection device 10C has the same structure as that of the detection device 20B other than the structure of the detection device 10A. In this modification, a detection element 20A is provided on the bottom surface 11B of the support body 11. The two waveguide structures 31B are provided on the bottom surface 11B of the support body 11 so as to sandwich the detection element 20A.

As in this modification, the detection element 20A may not be provided on the top surface 11A which is an irradiated surface of the electromagnetic wave (for example, the electromagnetic wave LA) in the support body 11, and may be provided on the bottom surface 11B on the back side. In this case, the electromagnetic wave LA is incident on the detection element 20A after passing through the support body 11, but preferable characteristics of the electromagnetic wave LA to be detected are maintained.

For example, when the wavelength of the electromagnetic wave LA is relatively large and the size of the detection element 20A is small, the arrangement as in this modification may be adopted. In the case where the detection element 20A and the waveguide structures 31B are provided on the same plane as in this modification, the distance L1 between the waveguide structures 31B must be larger than that of the detection element 20A. However, an effect of suppressing an incidence on the detection element 20A of an electromagnetic wave which should not be detected can be sufficiently obtained.

As described above, the detection device 10 according to this embodiment includes the support body 11 having one surface (the top surface 11A) to which an electromagnetic wave is irradiated, and at least one detection element 20 provided on the support body 11.

The detection device 10 also comprises at least one waveguide structure 31, each of which is supported by the support body 11 and has an aperture (a first aperture) AP1 opened to the one surface side of the support body 11, and which forms a waveguide WG that narrows in a direction away from the one surface. Therefore, it is possible to provide the electromagnetic wave detection device 10 which is capable of preventing an electromagnetic wave, which should not be detected, from being incident on the detection element 20 and performing an accurate detection operation.

Second Embodiment

Figure 6:
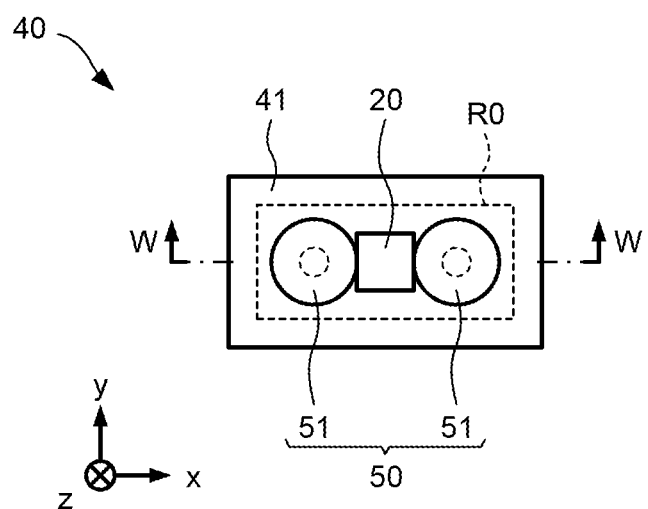
FIG. 6 is a top view of an electromagnetic wave detection device according to a second embodiment.
Figure 7:
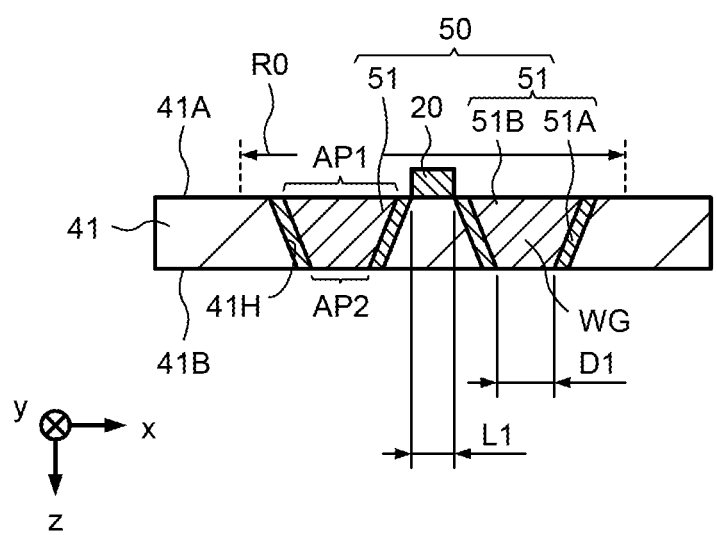
FIG. 7 is a cross-sectional view of an electromagnetic wave detection device according to the second embodiment

FIG. 6 is a top view of a detection device 40 according to the second embodiment. FIG. 7 is a sectional view made along a line W-W in FIG. 6, and is a cross-sectional view of the detection device 40. The detection device 40 will be described with reference to FIGS. 6 and 7. The detection device 40 has the same structure as that of the detection device 10 other than the structure of a support body 41 and an electromagnetic wave guide portion 50. In this embodiment, the electromagnetic wave guide portion 50 has two waveguide structures 51 formed inside the support body 41.

Specifically, as shown in FIG. 7, the support body 41 has two through-holes 41H each having a tapered shape to sandwich the detection element 20 when viewed from a direction perpendicular to a top surface 41A and to penetrate from the top surface (one surface) 41A to a bottom surface (the other surface) 41B of the support body. Each of the waveguide structures 51 includes a metal film 51A provided on an inner wall surface of the through-hole 41H.

In this embodiment, each of the waveguide structures 51 includes a translucent member 51B provided so as to fill an inner region of the metal film 51A. That is, a waveguide WG of each of the waveguide structures 51 is filled with the translucent member 51B. The translucent member 51B is made of a material having transparency (light-transmitting property) to the electromagnetic wave LA, for example, a resin material.

In this embodiment, a portion of the inner surface of the metal film 51A on the top surface 41A side of the support body 41 constitutes an aperture (a first aperture) AP1, and a portion of the inner surface of the metal film 51A on the bottom surface 41B side constitutes an aperture (a second aperture) AP2. Further, the translucent member 51B constitutes the waveguide WG in each of the waveguide structures 51. Accordingly, an electromagnetic wave such as the electromagnetic wave LB is guided through the translucent member 51B.

By arranging the waveguide structure 51 within the support body 41, the rigidity of the waveguide structure 51 and the strength for fixing to the support body 41 are increased. Further, by utilizing the space in the support body 41, the detection device 40 can be miniaturized.

In this embodiment, a distance L1 between the waveguide structures 51 and an aperture width D1 of the aperture AP2 may be determined in consideration of the materials (refractive indexes) of the support body 41 and the translucent member 51B, respectively.

Specifically, it is preferable that the distance L1 between the through-holes 41H on the top surface 41A of the support body 41 satisfies a relationship of $L1<(\lambda/(2*n1))$, where $\lambda$ is the wavelength of the electromagnetic wave LA and n1 is a refractive index of the support body 41. By arranging the two waveguide structures 51 at the intervals satisfying this relationship, an electromagnetic wave such as the electromagnetic wave LC (see FIG. 2) is prevented from entering the detection element 20 from the region between the waveguide structures 51.

In addition, it is preferable that the aperture width D1 of the metal film 51A (aperture AP2) on the bottom surface 41B of the support body 41 satisfies a relationship of D1 ($\lambda$/

(2*n2)), where A is the wavelength of the electromagnetic wave LA and n2 is a refractive index of the translucent member 51B. By satisfying this relationship, the electromagnetic wave LB in the waveguide WG (the translucent member 51B) is reliably emitted from the aperture AP2. Therefore, an electromagnetic wave such as the electromagnetic wave LB is prevented from returning to the detection element 20 side, and the incidence of the electromagnetic wave which should not be detected, to the detection element 20 is suppressed.

In this embodiment, the case where the waveguide structure 51 includes the translucent member 51B has been described. However, the waveguide structure 51 may not have the translucent member 51B, and may be made of only the metal film 51A, for example. In addition, since the waveguide structure 51 includes the translucent member 51B, protection (prevention of peeling) of the metal film 51A and the like can be performed. Therefore, the quality stability of the waveguide structure 51 and the quality of the detection device 40 can be improved.

Further, the translucent member 51B may be filled in the waveguide WG of a waveguide structure according to the other embodiments and modifications thereof, for example, in the waveguide WG of the waveguide structure 31 in the detection device 10. In addition, for example, when the waveguide structures 31C of the detecting device 10C include the translucent members 51B, the aperture width D1 of the aperture AP2 may be set in consideration of the refractive index of the translucent member 51B.

In addition, when the waveguide structure 51 does not have the translucent member 51B, it forms a hollow waveguide WG. In this case, when the wavelength of the electromagnetic wave LB (and the electromagnetic wave LA) is A and the refractive index in the waveguide WG is n, the aperture width D1 of the aperture AP1 satisfies a relationship of $D1 \geq (\lambda/(2n))$, whereby the electromagnetic wave can be reliably guided to the bottom surface 41B side.

In addition, in this embodiment, the case where the end portions of the waveguide WG in the waveguide structure 51 are formed on the top surface 41A and the bottom surface 418B of the support body 41, respectively has been described. However, the structure of the waveguide structure 51 is not limited thereto.

For example, the aperture AP2 of the waveguide structure 51 may project from the bottom surface 41B of the support body 41. Specifically, the support body 41 may have a convex portion projecting from the bottom surface 41B, and the through-hole 41H and the metal film 51A may be provided on the convex portion. In this case, the end portion (aperture AP2) of the waveguide structure 51 is provided at a position projecting from the bottom surface 41B. In addition, an end portion opposite to the aperture AP1 of the waveguide structure 51 may be closed.

As described above, in this embodiment, the support body 41 includes two through-holes 41H that sandwich the detection element 20 when viewed from the direction perpendicular to the top surface 41A and penetrate through the support body 41 from the top surface 41A to the bottom surface 41B of the support body 41. Each of the waveguide structures 51 includes the metal film 51A provided on the inner wall surface of the through-hole 41H. Therefore, it is possible to provide the electromagnetic wave detection device 40 which prevents an electromagnetic wave, which should not be detected, from being incident on the detection element 20, so that an accurate detection operation can be performed.

Third Embodiment

Figure 8:
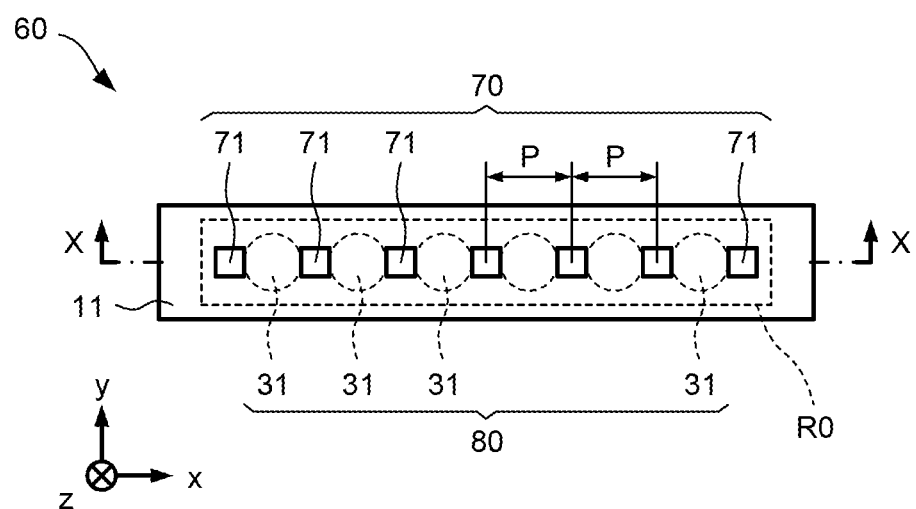
FIG. 8 is a top view of an electromagnetic wave detection device according to a third embodiment.
Figure 9:
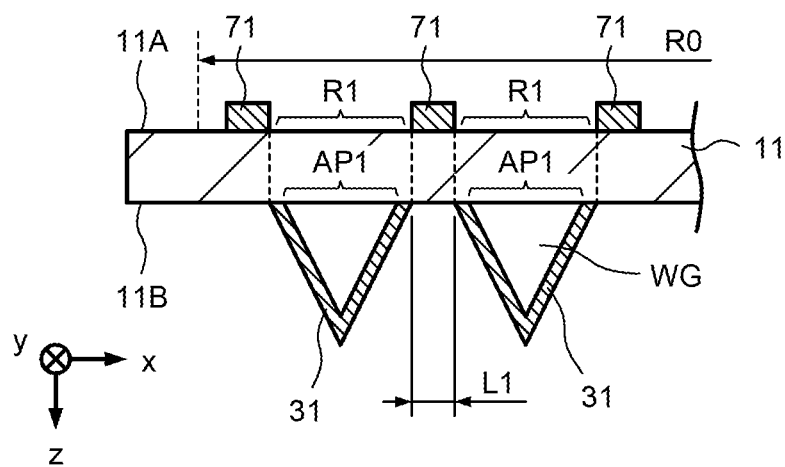
FIG. 9 is a cross-sectional view of an electromagnetic wave detection device according to the third embodiment.

FIG. 8 is a top view of the detection device 60 according to the third embodiment. FIG. 9 is a cross-sectional view made along a line X-X in FIG. 8, and is a cross-sectional view of the detection device 60, but only a part thereof is shown. The detection device 60 will be described with reference to FIGS. 8 and 9.

In this embodiment, a detection part 70 includes a plurality of detection elements 71 arranged in a matrix. An electromagnetic wave guide portion 80 includes a plurality of waveguide structures 31 provided in inter-element regions R1, each of which is an area between the plurality of detection elements 71.

In this embodiment, the detection part 70 includes seven detection elements 71 aligned in one row and arranged at the same pitch (cycle) P. In this embodiment, the arrangement direction of the detection elements 71 on the support body 11 is referred to as "x direction." In this embodiment, the support body 11 has a rectangular top surface shape whose longitudinal direction is the x direction, and each of the detection elements 71 is arranged along the longitudinal direction of the support body 11.

In addition, in this embodiment, an electromagnetic wave to be detected is irradiated to the top surface 11A of the support body 11 in a line shape. Therefore, as shown in FIG. 8, the irradiation region R0 of the electromagnetic wave in the support body 11 is formed to be elongated in a line shape. Further, each of the detection elements 71 independently performs a detection operation of an electromagnetic wave.

The arrangement direction and the arrangement form of the detection elements 71 are not limited thereto. For example, each of the detection elements 71 may be arranged in two or more rows. The detection elements 71 may be arranged in a matrix shape at a distance separated from each other.

In addition, in this embodiment, each of the waveguide structures 31 is provided in a region R1 between one detection element 71 and another detection element 71 adjacent to the one detection element 71 when viewed from the direction perpendicular to the top surface (one surface) 11A of the support body 11. Further, each of the waveguide structures 31 has an aperture AP1 opened to the top surface 11A side to form a tapered waveguide WG.

In this embodiment, each of the waveguide structures 31 is provided in each of the inter-element regions R1. Similarly to the detection device 10, the waveguide structures 31 are arranged apart from each other by a distance L1.

Each of the waveguide structures 31 suppresses a detection operation (an erroneous detection) of an electromagnetic wave which should not be detected, in each of the detection elements 71. Specifically, by providing the waveguide structures 31 in the inter-element regions R1, for example, it is possible to suppress erroneous detections of the detection elements 71 in the case where the detection elements 71 detect the components of electromagnetic waves different from each other.

For example, the detection device 60 may be used as a line sensor. In this case, an electromagnetic wave to be detected is distinguished for each of the detection elements 71, and changes at each time point. In this case, an electromagnetic wave irradiated to the inter-element region R1 (for example, an electromagnetic wave such as the electromagnetic wave LB shown in FIG. 2) may be incident on the adjacent detection element 71, thereby adversely affecting the detection accuracy.

By contrast, since each of the waveguide structures 31 is provided in each of the inter-element regions R1, electromagnetic waves which are not directly incident on the detection element 71 can be reliably separated or blocked from the detection element 71. Therefore, accurate electromagnetic wave detection can be carried out for each of the detection elements 71.

Further, the detection device 60 may be an image sensor such as an image scanner. In this case, the electromagnetic wave to be detected by the detection device 60 is, for example, an electromagnetic wave which is reflected or transmitted by an object (an object to be imaged) after having be irradiated to the object. Further, when the detection device 60 is combined with a mechanism for moving the object, the intensity of the electromagnetic wave to be detected by each of the detection elements 71 changes at each time point In this case, each of the detection elements 71 independently detects the intensity of the irradiated electromagnetic wave. Further, each of the detection elements 71 repeatedly performs the electromagnetic wave detection operation for each predetermined time interval. For example, the intensity of the electromagnetic wave detected by each of the plurality of detection elements 71 is used as a pixel, and the detection result of the entire detection part 70 is image data constituting an image.

For such applications, the detection of an electromagnetic wave which should not be detected, in each of the detection elements 71 leads to a reduction in image quality. Therefore, when the detection device 60 having the waveguide structures 31 described above is used as an imaging device, an accurate imaging operation can be performed, and a high-quality image can be obtained.

When the plurality of detection elements 71 are arranged as in this embodiment, it is preferable that the pitch P satisfies a relationship of P>($\lambda$/2) when the wavelength of an electromagnetic wave to be detected (for example, the electromagnetic wave LA shown in FIG. 2) is $\lambda$. By adjusting the arrangement pitch P of the detection elements 71 to satisfy this relationship, the same electromagnetic wave is suppressed from being incident between the adjacent detection elements 71. Therefore, electromagnetic wave detection can be accurately performed for each of the detection elements 71.

As described above, in this embodiment, the detection device 60 includes the plurality of detection elements 71 arranged in a matrix when viewed from a direction perpendicular to one surface (the top surface 11A) of the support body 11, and each of the waveguide structures 31 is provided in each of the inter-element regions R1 of the plurality of detection elements 71 when viewed from the direction perpendicular to the one surface of the support body 11. Therefore, it is possible to provide the electromagnetic wave detection device 60 which prevents an electromagnetic wave, which should not be detected, from being incident on each of the plurality of detection elements 71, so that an accurate detection operation can be performed.

DESCRIPTION OF REFERENCE NUMERALS 10, 10A, 10B, 10C, 40, 60 Electromagnetic wave detection device
11, 41 Support body
11A Irradiation surface
20, 20A, 71 Electromagnetic wave detection element
31, 31A, 31B, 51 Waveguide structure
AP1 Aperture
WG Waveguide

The invention claimed is:

1. An electromagnetic wave detection device comprising:
a support body having one surface to be irradiated with an electromagnetic wave;
at least one electromagnetic wave detection element provided on said support body; and
a plurality of waveguide structures each of which is supported on said support body, has a first aperture opened to a side of said one surface of said support body, and forms a waveguide that narrows in a direction away from said one surface, wherein
said plurality of waveguide structures are arranged to sandwich said at least one electromagnetic wave detection element when viewed from a direction perpendicular to said one surface of said support body, and
a distance L1 between the first apertures in said plurality of waveguide structures satisfies a relationship of L1< ($\lambda$/2), where $\lambda$ is a wavelength of said electromagnetic wave radiated to said one surface.

2. The electromagnetic wave detection device according to claim 1, wherein said first aperture of each of said plurality of waveguide structures is arranged to surround each said at least one electromagnetic wave detection element when viewed from the direction perpendicular to said one surface of said support body.

3. The electromagnetic wave detection device according to claim 1, wherein said support body has a flat plate shape having another surface opposite to said one surface,
each said at least one electromagnetic wave detection element is provided on said one surface of said support body, and
each of said plurality of waveguide structures is provided on the other side of said support body.

4. The electromagnetic wave detection device according to claim 1, wherein said support body has a flat plate shape having another surface opposite to said one surface, and
each said at least one electromagnetic wave detection element and each of said plurality of waveguide structures are provided on said one surface of said support body.

5. The electromagnetic wave detection device according to claim 1, wherein said plurality of waveguide structures comprises two waveguide structures,
said support body has a flat plate shape having another surface opposite to said one surface,
said support body has two through-holes which are arranged so as to sandwich said at least one electromagnetic wave detection element when viewed from the direction perpendicular to said one surface, and which penetrate through the support body from said one surface to the other surface, and
each of said two waveguide structures includes a metal film provided on an inner wall surface of each of said two through-holes.

6. The electromagnetic wave detection device according to claim 5, wherein said waveguide of each of said two waveguide structures is filled with a translucent member,
said distance L1 between said through-holes on said one surface of said support body satisfies a relationship of L1<($\lambda$/(2*n1)), where $\lambda$ is a wavelength of said electromagnetic wave irradiated onto said one surface and n1 is a refractive index of said support body, and
an aperture width D1 of said metal film on said other surface of said support body satisfies a relationship of D1> ($\lambda$/(2*n2)), where $\lambda$ is the wavelength of said electromagnetic wave irradiated onto said one surface and n2 is a refractive index of said translucent member.

7. The electromagnetic wave detection device according claim 1, wherein each of said plurality of waveguide structures are has a second aperture at an end opposite to said first aperture in said waveguide, an aperture width D1 of said second aperture satisfies a relationship of $D1 > (\lambda/(2n))$, where $\lambda$ is the wavelength of said electromagnetic wave irradiated onto said one surface and 2n is a refractive index in said waveguide.

8. The electromagnetic wave detection device according to claim 1, wherein said waveguide of each of said plurality of waveguide structures is closed at an end opposite to said first aperture.

9. The electromagnetic wave detecting apparatus according to claim 1 comprising a plurality of electromagnetic wave detection elements arranged in a matrix when viewed from the direction perpendicular to said one surface, wherein said plurality of waveguide structures are respectively provided in inter-element regions of said plurality of electromagnetic wave detection elements when viewed from the direction perpendicular to said one surface of said support body.

* * * * *